United States Patent
Bargauan

Patent Number: 6,023,614
Date of Patent: Feb. 8, 2000

[54] METHOD FOR DECODING A SUPPRESSED-CARRIER MODULATED SIGNAL IN THE PRESENCE OF A PILOT TONE, PARTICULARLY FOR FM SIGNALS

[75] Inventor: Michele Bargauan, Milan, Italy

[73] Assignee: M. B. International, S.r.l., Livigno, Italy

[21] Appl. No.: 08/888,913

[22] Filed: Jul. 7, 1997

[30] Foreign Application Priority Data

Jul. 29, 1996 [IT] Italy .................................. MI96A1619

[51] Int. Cl.[7] .................................................. H04B 1/16
[52] U.S. Cl. .............................. 455/203; 455/46; 455/47; 455/202; 375/320
[58] Field of Search .................................. 455/46, 47, 48, 455/201, 202, 203, 260; 329/356, 357, 358; 375/320, 321

[56] References Cited

U.S. PATENT DOCUMENTS

| | | | |
|---|---|---|---|
| 4,328,590 | 5/1982 | Lee | 455/203 |
| 4,726,069 | 2/1988 | Stevenson | 455/46 |
| 4,955,083 | 9/1990 | Phillips et al. | 455/47 |
| 5,507,024 | 4/1996 | Richards | 455/46 |

*Primary Examiner*—Lee Nguyen
*Attorney, Agent, or Firm*—Guido Modiano; Albert Josif

[57] ABSTRACT

A method for decoding a suppressed-carrier modulated signal in the presence of a pilot tone, comprising the steps of:

extracting the pilot signal from the modulated signal;
obtaining the suppressed carrier by multiplying the pilot signal by the pilot signal in quadrature;
adjusting the level of the suppressed carrier; and
reconstructing the modulating signal.

17 Claims, 2 Drawing Sheets

METHOD FOR DECODING A SUPPRESSED-CARRIER MODULATED SIGNAL IN THE PRESENCE OF A PILOT TONE, PARTICULARLY FOR FM SIGNALS

BACKGROUND OF THE INVENTION

The present invention relates to a method for decoding a suppressed-carrier modulated signal in the presence of a pilot tone, particularly for frequency modulation, and to an apparatus for implementing it.

In conventional signal transmission methods a signal is broadcast by means of suppressed-carrier amplitude-modulated carriers in the presence of a reference tone, known as pilot tone, whose frequency is half that of the signal to be broadcast and whose amplitude is variable.

Demodulation of the signal upon reception occurs by reconstructing the carrier by means of a phase-locking oscillation circuit (PLL) which uses the pilot tone as a reference for locking.

This method is widely used in frequency-modulation (FM) radio broadcasts for stereo signals.

A drawback of the above-described method resides in the fact that although it is suitable for analog implementations, it is poorly suited to digital circuits, since it is impossible to produce digital PLLs.

Moreover, the phase precision of the reconstructed carrier is always affected by an unpredictable error, which can be reduced to very small values in high-level and high-cost equipment.

Finally, the analog implementation requires a large number of components which require calibrations, with the consequent problems in terms of cost, stability and quality in general.

SUMMARY OF THE INVENTION

A principal aim of the present invention is to provide a method for decoding a suppressed-carrier modulated signal in the presence of a pilot tone which overcomes the drawbacks of the prior art, allowing fully-digital decoding.

Within the scope of this aim, an object of the present invention is to provide a method for decoding a suppressed-carrier modulated signal in the presence of a pilot tone which allows to work over a very wide frequency range.

Another object of the present invention is to provide a method for decoding a suppressed-carrier signal in the presence of a pilot tone which is insensitive to variations in the level of the pilot tone.

Another object of the present invention is to provide a method for decoding a suppressed-carrier signal in the presence of a pilot tone which allows to produce circuits having the chosen precision by increasing the precision of the computing circuits.

Another object of the present invention is to provide a method which is highly reliable and relatively easy to provide at competitive costs.

This aim, these objects and others which will become apparent hereinafter are achieved by a method for decoding a suppressed-carrier modulated signal in the presence of a pilot tone, comprising the steps of:

extracting the pilot signal from the modulated signal;

obtaining the suppressed carrier by multiplying the pilot signal by said pilot signal in quadrature;

adjusting the level of the suppressed carrier; and reconstructing the modulating signal.

BRIEF DESCRIPTION OF THE DRAWINGS

Further characteristics and advantages of the present invention will become apparent from the following detailed description of a preferred but not exclusive embodiment of the method according to the invention, illustrated only by way of non-limitative example in the accompanying drawings, wherein.

DESCRIPTION OF THE PREFERRED EMBODIMENTS

Figure 1:
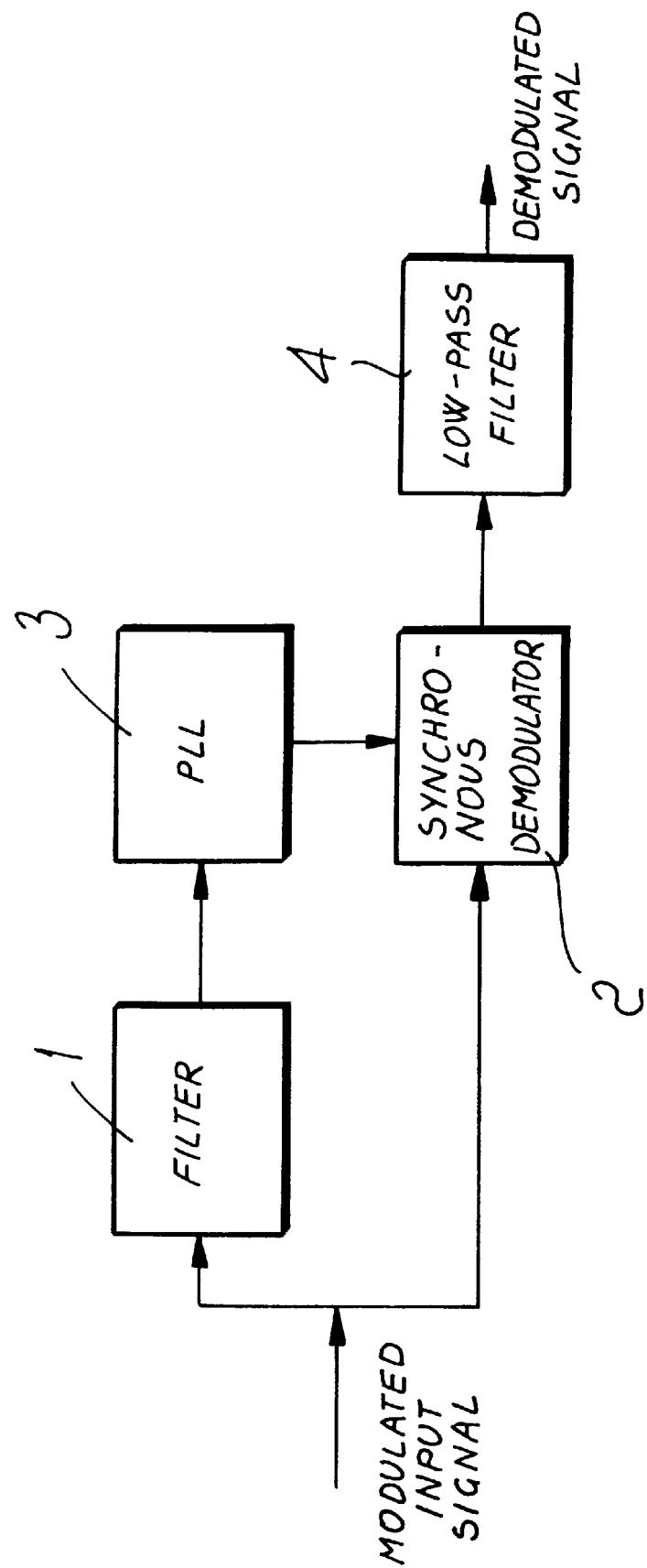
FIG. 1 is a block diagram of the apparatus that implements the method for decoding a suppressed-carrier modulated signal in the presence of a pilot tone, according to the prior art.

With reference to FIG. 1, it is shown a conventional apparatus that implements a conventional decoding method.

According to this conventional method, the modulated input signal, broadcast by broadcasting means, is sent to a filter 1 to separate the carrier and to a synchronous demodulator 2.

The signal in output from the filter 1 is sent to a PLL oscillator 3, whose output is sent to the synchronous demodulator 2. The signal in output from the synchronous demodulator is then sent to a low-pass filter 4, whose output is the final decoded signal.

Figure 2:
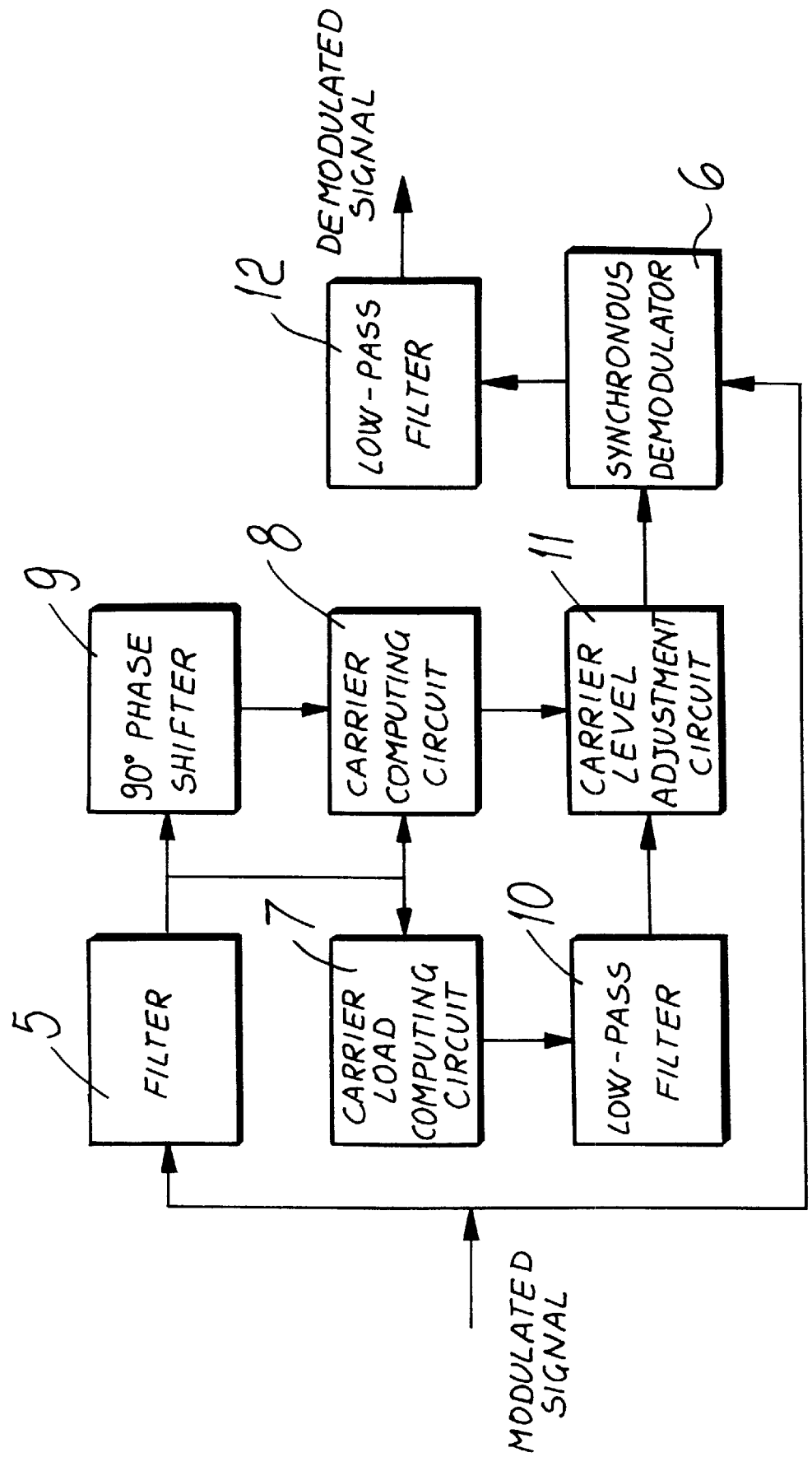
FIG. 2 is a block diagram of the apparatus that implements the decoding method according to the present invention.

With reference now to FIG. 2, the method according to the invention is described.

The suppressed-carrier modulated signal in the presence of a pilot tone is input to a filter 5 for separating the pilot tone and into a synchronous demodulator 6.

The signal in output from the filter 5 is sent to a 90° phase shifter, designated by the reference numeral 9, to means 7 for computing the level of the carrier, and to means 8 for computing the carrier, which also receive in input the signal in output from the phase shifter 9.

The signal in output from the means 7 for computing the level of the carrier enters a low-pass filter 10, whose output is sent to carrier level adjustment means 11 whose output is sent to the synchronous demodulator 6.

The signal in output from the synchronous demodulator 6 is sent through a low-pass filter 12, whose output constitutes the decoded signal.

With reference to the above-described decoding apparatus, the decoding method according to the invention is as follows.

First of all, the pilot signal is extracted from the modulated signal by means of a conventional phase filtering performed by the filter 5.

Assume that the expression:

$$\cos(d) \sin(2wt)$$

represents the suppressed-carrier modulated signal, and that the expression $$\text{pilot} = p \sin(wt)$$

represents the pilot signal.

The total signal, i.e., the suppressed-carrier modulated signal in the presence of a pilot tone, is therefore:

$$S_{tot} = \cos(d) \sin(2wt) + p \sin(wt).$$

The pilot signal p sin (wt) is thus obtained in output from the filter 5.

Then a quadrature pilot tone is computed by using a 90° phase shifter 9 or another equivalent procedure which produces a similar phase shift with a known gain.

The quadrature pilot tone is therefore:

$$\text{pilot}(90°) = p \cos(wt).$$

At this point, the carrier is computed by multiplying the pilot tone in output from the pilot tone separator 5 by the quadrature pilot tone (i.e., the pilot tone phase-shifted by 90°) output by the 90° phase shifter 9. This multiplication is performed by the carrier computing means 8.

One thus obtains:

$$B = p^2 \sin(2wt)/2$$

The carrier level computing means 7 square the pilot tone and the filtering means 10 filter the high-frequency components.

One thus obtains:

$$A = (p^2 - p^2 \cos(2wt)), \text{ and by filtering one obtains}$$

$$A_{filtered} = p^2/2$$

The carrier level adjustment means 11 normalize the carrier output by the carrier computing means 8. This normalization is performed by dividing the carrier by the square of the filtered pilot tone.

Therefore, one obtains $B_{normalized} = B/A_{filtered}$, i.e.:

$$B_{normalized} = \sin(2wt).$$

At this point the modulating signal is reconstructed by multiplying, by means of the synchronous demodulator 6, the modulated signal in input by the normalized carrier.

Therefore, the demodulated signal is equal to:

$$S_{demodulated} = \cos(d)/2 - \cos(-d+4wt)/4 - \cos(d+4wt)/4 + p\cos(wt)/2 - p\cos(3wt)/2$$

The signal in output from the synchronous demodulator 6 is appropriately filtered by means of the low-pass filter 12.

One thus obtains the demodulated filtered signal:

$$S_{demodulated-filtered} = \cos(d)/2$$

In practice, it has been observed that the method according to the invention fully achieves the intended aim, since it allows to provide fully digital decoders which operate over a wide frequency range.

Moreover, decoders provided according to the invention do not require calibrations and are insensitive to variations in the level of the pilot tone.

The method thus conceived is susceptible of numerous modifications and variations, all of which are within the scope of the inventive concept.

Thus, for example, the carrier normalization stage can be replaced with a gain control loop which has the purpose of adjusting the amplitude of the pilot tone so that the signal obtained by multiplying the pilot tone by itself and by the gain of the phase shifter 9 has a unit value.

It is also possible to replace the phase shifter 9 with a delay line and to choose the sampling frequency so that the delay line is equivalent to a delay (phase shift) of 90°.

Finally, all the details may be replaced with other technically equivalent elements.

In practice, the materials employed, so long as they are compatible with the specific use, as well as the dimensions, may be any according to requirements and to the state of the art.

What is claimed is:

1. A method for decoding a suppressed-carrier modulated signal in the presence of a pilot tone signal, comprising the steps of:

extracting the pilot tone signal from the modulated signal;

obtaining a suppressed carrier by multiplying the pilot tone signal by said pilot tone signal in quadrature;

adjusting the level of the suppressed carrier; and reconstructing the modulating signal.

2. The method according to claim 1, wherein the step of extracting the pilot tone signal from the modulated signal is provided by means of a filtering step.

3. The method according to claim 1, wherein the step of adjusting the level of the suppressed carrier comprises the steps of normalizing the carrier by dividing by the square of the pilot tone signal with its high-frequency components filtered out.

4. The method according to claim 1, wherein the step of adjusting the level of the suppressed carrier comprises the steps of adjusting the amplitude of the pilot tone signal by means of a gain control loop, in order to adjust the amplitude of the pilot tone signal so that a signal obtained by squaring the pilot tone signal and multiplying said pilot tone signal by the gain of a phase shifter suitable to produce the quadrature pilot tone signal has a unit value.

5. The method according to claim 1, wherein the step of reconstructing the modulating signal comprises a synchronous demodulation step.

6. The method according to claim 5, wherein said demodulation step of said modulating signal consists in multiplying the modulated signal by the level-adjusted carrier.

7. The method according to claim 5, characterized in that it comprises a filtering step after the demodulation step in order to obtain said modulating signal.

8. An apparatus for decoding a suppressed-carrier modulated signal in the presence of a pilot tone signal, comprising:

means for separating the pilot tone signal from the suppressed-carrier modulated signal;

means for determining a suppressed carrier;

means for adjusting the level of the suppressed carrier; and means for reconstructing a modulating signal, of said suppressed-carrier modulated signal, wherein said means for determining the suppressed carrier comprise 90° phase shifting means and carrier computing means, said phase shifting means receiving in input said pilot tone signal and said carrier computing means receiving in input said pilot tone signal and said pilot tone signal phase-shifted by 90° in output from said phase shifting means.

9. The apparatus according to claim 8, wherein said means for separating the pilot tone signal comprise filtering means which receive in input the suppressed-carrier modulated signal.

10. The apparatus according to claim 8, wherein said carrier level adjustment means comprise carrier level computing means for squaring the pilot tone signal, filtering means for filtering out the high-frequency components, and means for dividing the carrier by the squared and filtered pilot tone signal.

11. The apparatus according to claim 8, wherein said means for reconstructing the modulating signal comprise synchronous demodulation means which receive in input said suppressed-carrier modulated signal and said level-adjusted carrier.

12. The apparatus according to claim 8, further comprising low-pass filter means which are cascade-connected to said means for reconstructing the modulating signal in order to obtain said modulating signal.

13. An apparatus for decoding a suppressed-carrier modulated signal in the presence of a pilot tone signal, comprising:

means for separating the pilot tone signal from the suppressed-carrier modulated signal;

means for determining a suppressed carrier;

means for adjusting the level of the suppressed carrier; and means for reconstructing a modulating signal of said suppressed-carrier modulated signal, wherein said carrier level adjustment means comprise carrier level computing means for squaring the pilot tone signal, filtering means for filtering out the high-frequency components, and means for dividing the carrier by the squared and filtered pilot tone signal.

14. The apparatus according to claim 13, wherein said means for separating the pilot tone signal comprise filtering means which receive in input the suppressed-carrier modulated signal.

15. The apparatus according to claim 13, wherein said means for determining the suppressed carrier comprise 90° phase shifting means and carrier computing means, said phase shifting means receiving in input said pilot tone signal and said carrier computing means receiving in input said pilot tone signal and said pilot tone signal phase-shifted by 90° in output from said phase shifting means.

16. The apparatus according to claim 13, wherein said means for reconstructing the modulating signal comprise synchronous demodulation means which receive in input said suppressed-carrier modulated signal and said level-adjusted carrier.

17. The apparatus according to claim 13, further comprising low-pass filter means which are cascade-connected to said means for reconstructing the modulating signal in order to obtain said modulating signal.

* * * * *